(12) United States Patent
Lee et al.

(10) Patent No.: US 11,393,922 B2
(45) Date of Patent: Jul. 19, 2022

(54) SEMICONDUCTOR DEVICES HAVING A METAL OXIDE SEMICONDUCTOR STRUCTURE

(71) Applicant: SAMSUNG ELECTRONICS CO., LTD., Suwon-Si (KR)

(72) Inventors: Kyuok Lee, Yongin-Si (KR); Jaehyun Yoo, Suwon-Si (KR); Jungkyung Kim, Seoul (KR); Juhyeon Song, Bucheon-Si (KR); Suyeon Cho, Hwaseong-Si (KR); Wonpyo Hong, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 24 days.

(21) Appl. No.: 17/034,941

(22) Filed: Sep. 28, 2020

(65) Prior Publication Data
US 2021/0159333 A1 May 27, 2021

(30) Foreign Application Priority Data
Nov. 21, 2019 (KR) .................. 10-2019-0150271

(51) Int. Cl.
*H01L 29/78* (2006.01)
*H01L 29/08* (2006.01)
*H01L 29/10* (2006.01)
*H01L 27/11573* (2017.01)
*H01L 27/11526* (2017.01)
*H01L 29/06* (2006.01)

(52) U.S. Cl.
CPC .... *H01L 29/7816* (2013.01); *H01L 27/11526* (2013.01); *H01L 27/11573* (2013.01); *H01L 29/0653* (2013.01); *H01L 29/1095* (2013.01)

(58) Field of Classification Search
CPC .. H01L 27/11; H01L 27/115; H01L 27/11526; H01L 27/11573; H01L 29/06; H01L 29/0653; H01L 29/08; H01L 29/0847; H01L 29/10; H01L 29/1095; H01L 29/42; H01L 29/4238; H01L 29/42368; H01L 29/78; H01L 29/7802; H01L 29/7816; H01L 29/7835
USPC ........................................................ 257/335
See application file for complete search history.

(56) References Cited

U.S. PATENT DOCUMENTS

| 8,304,831 | B2 | 11/2012 | Zhu et al. |
| 8,390,057 | B1 | 3/2013 | Zuniga et al. |
| 8,853,764 | B1 | 10/2014 | Zhang et al. |
| 9,059,276 | B2 | 6/2015 | Feilchenfeld et al. |
| 9,082,846 | B2 | 7/2015 | Lu et al. |

(Continued)

*Primary Examiner* — Fazli Erdem
(74) *Attorney, Agent, or Firm* — F. Chauu & Associates, LLC

(57) ABSTRACT

A semiconductor device includes a semiconductor substrate. A drift region is disposed in the semiconductor substrate. The drift region has a first conductivity type. A body region is disposed in the semiconductor substrate, adjacent to the drift region. The body region has a second conductivity type. A drain region is disposed opposite to the body region in the drift region. A drain isolation insulating film is disposed in a portion adjacent to the drain region of the drift region. A gate insulating film is disposed on the semiconductor substrate and is extended over a portion of the body region and a portion of the drift region. A gate electrode is disposed on the gate insulating film and the gate electrode has at least one closed-type opening.

19 Claims, 13 Drawing Sheets

(56) References Cited

U.S. PATENT DOCUMENTS

| | | |
|---|---|---|
| 9,647,110 B2 | 5/2017 | Wang et al. |
| 9,905,428 B2 | 2/2018 | Strachan et al. |
| 2013/0341714 A1 | 12/2013 | Jang et al. |
| 2015/0270389 A1* | 9/2015 | Iravani .............. H01L 29/66681 |
| | | 257/339 |

* cited by examiner

III1-III1' (III2-III2')

III1-III1'

III2-III2'

III1-III1'

II2-II2'

SEMICONDUCTOR DEVICES HAVING A METAL OXIDE SEMICONDUCTOR STRUCTURE

CROSS-REFERENCE TO RELATED APPLICATION(S)

This application claims the benefit of and priority to Korean Patent Application No. 10-2019-0150271, filed on Nov. 21, 2019 in the Korean Intellectual Property Office, the disclosure of which is herein incorporated by reference in its entirety.

TECHNICAL FIELD

The present disclosure relates to a semiconductor device, and more specifically, to a semiconductor device having a metal oxide semiconductor (MOS) structure.

DISCUSSION OF THE RELATED ART

Electronic devices are becoming more compact, lighter, and more versatile. Accordingly, power metal oxide semiconductor (MOS) transistors are often used in various types of semiconductor devices. One example of such a power MOS transistor is a Laterally Diffused Metal Oxide Semiconductor (LDMOS) transistor. In the LDMOS transistor, a channel region and a drain electrode are divided by a drift region and/or a well region, so an operation thereof could be controlled by a gate electrode.

SUMMARY

A semiconductor device includes a semiconductor substrate. A drift region having a first conductivity type is disposed in the semiconductor substrate. A body region is disposed in the semiconductor substrate adjacent to the drift region. The body region has a second conductivity type. A drain region is disposed opposite to the body region in the drift region. A drain isolation insulating film is disposed in a portion adjacent to the drain region of the drift region. A gate insulating film is disposed on the semiconductor substrate and is extended over both a portion of the body region and a portion of the drift region. A gate electrode is disposed on the gate insulating film. The gate electrode has at least one closed-type opening.

A semiconductor device includes a semiconductor substrate. A drift region having a first conductivity type is disposed in the semiconductor substrate and extends to an upper surface of the semiconductor substrate. A body region having a second conductivity type is disposed in the semiconductor substrate and shares a boundary with the drift region. The body region extends to an upper surface of the semiconductor substrate. A gate insulating film is disposed on a boundary between the body region and the drift region and extends over both a portion of the body region and a portion of the drift region. A gate electrode is disposed on the gate insulating film and has a plurality of closed-type openings. Each of the plurality of closed-type openings has a region overlapping the drift region.

A semiconductor device includes a semiconductor substrate. A drift region having a first conductivity type is disposed in the semiconductor substrate. A body region having a second conductivity type is disposed in the semiconductor substrate and is adjacent to the drift region. A drain region having the first conductivity type is disposed opposite to the body region in the drift region. A source region having the first conductivity type is disposed in the body region. A body contact region having the second conductivity type is disposed adjacent to the source region in the body region. A drain isolation insulating film is disposed in a portion adjacent to the drain region of the drift region. A gate electrode is disposed on the semiconductor substrate and extends over both a portion of the body region and a portion of the drift region. The gate electrode has at least one closed-type opening. A gate insulating film is disposed between the gate electrode and the semiconductor substrate. A first conductivity type impurity region is disposed in the drift region at least partially overlapping the at least one closed-type opening and has an impurity concentration that is greater than an impurity concentration of the drift region.

BRIEF DESCRIPTION OF DRAWINGS

A more complete appreciation of the present disclosure and many of the attendant aspects and features thereof will be more clearly understood from the following detailed description, taken in conjunction with the accompanying drawings, in which:

FIGS. 11B, 12A, 12B, 13A and 13B are cross-sectional views (II2-II2') illustrating a method of manufacturing a semiconductor device according to an example embodiment of the present disclosure.

DETAILED DESCRIPTION

Hereinafter, example embodiments of the present disclosure will be described in more detail with reference to the attached drawings.

Figure 1:
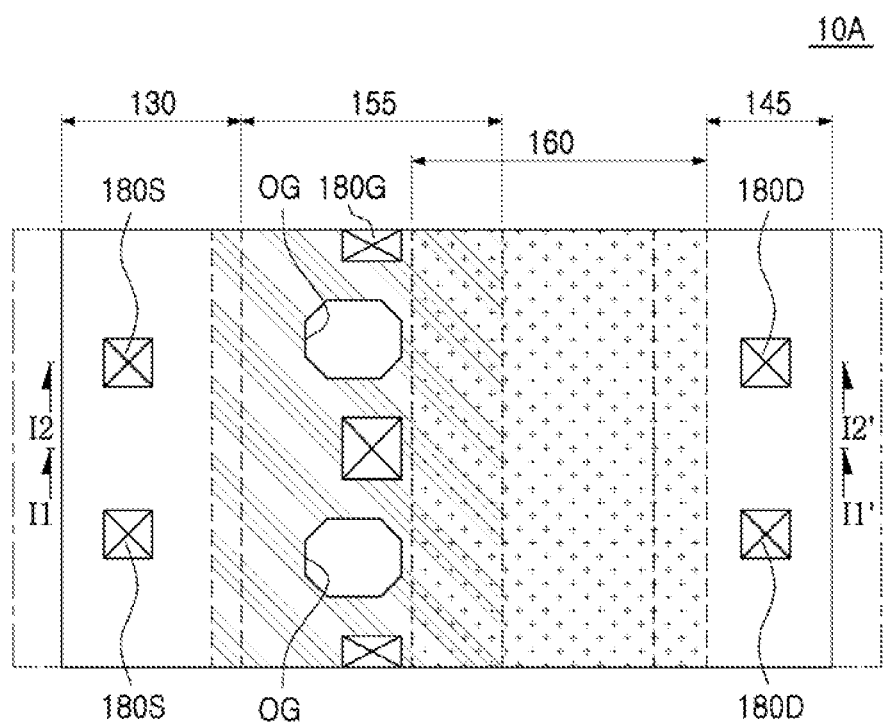
FIG. 1 is a plan view illustrating a semiconductor device (e.g. a power MOS transistor) according to an example embodiment of the present disclosure.
Figure 2A:
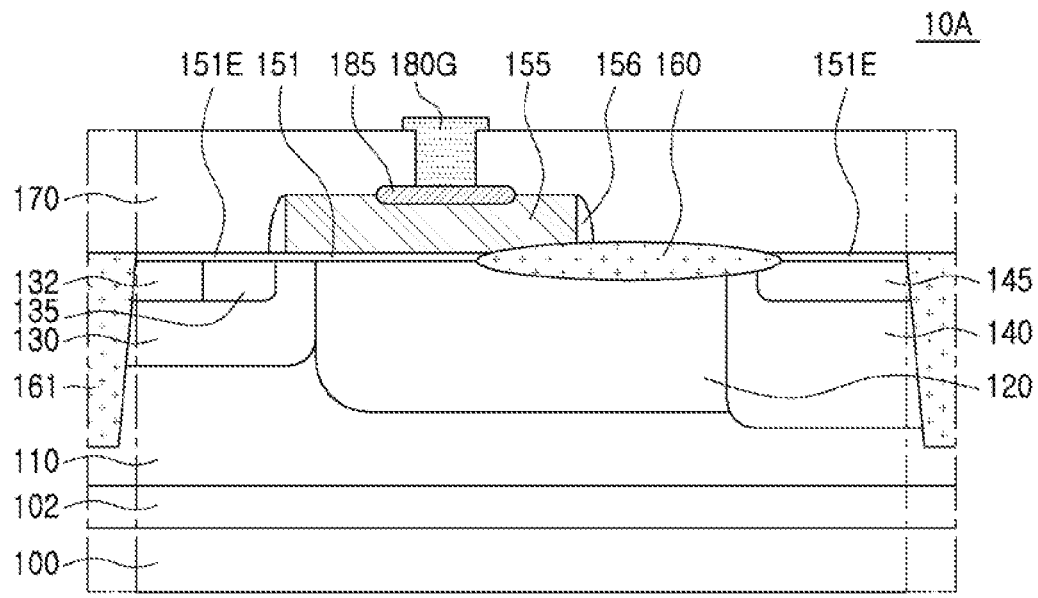
FIGS. 2A and 2B are cross-sectional views illustrating the semiconductor device of FIG. 1 taken along lines I1-I1' and I2-I2'.
Figure 2B:
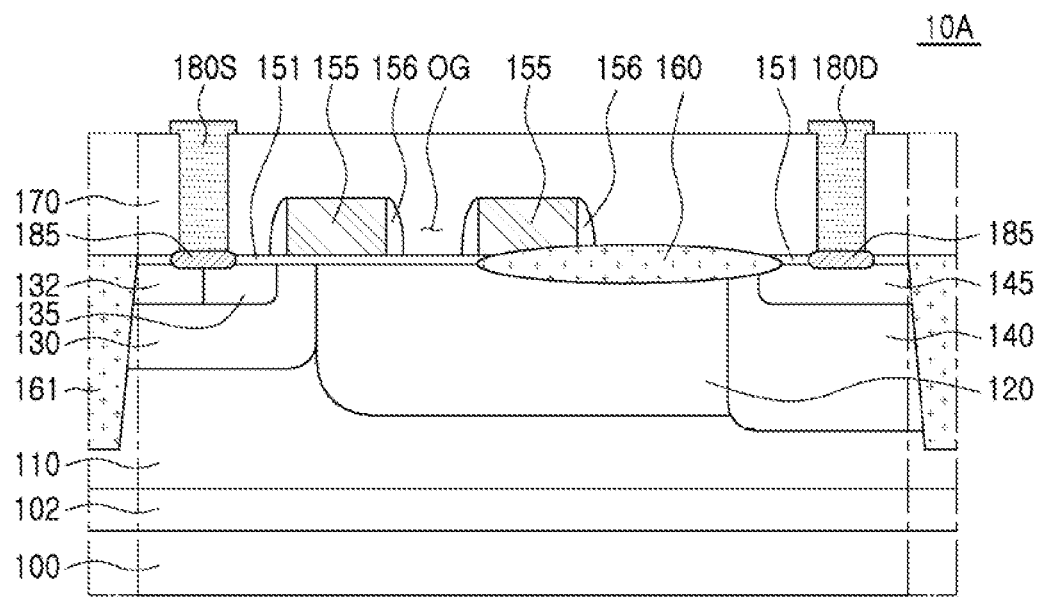

FIG. 1 is a plan view illustrating a semiconductor device (e.g. a power MOS transistor) according to an example embodiment of the present disclosure, and FIGS. 2A and 2B are cross-sectional views illustrating the semiconductor device of FIG. 1 taken along lines I1-I1' and I2-I2'.

Referring to FIGS. 1, 2A, and 2B, a semiconductor device 10A having a MOS structure, according to an example embodiment, includes a semiconductor substrate 100, a drift region 120 disposed in the semiconductor substrate 100 and having a first conductivity type, and a body region 130 disposed in the semiconductor substrate 100, and having a second conductivity type. The second conductivity type may be different than or opposite to the first conductivity type.

The semiconductor substrate 100, employed in an example embodiment, may have a second conductivity type well 110 (e.g. a well that has the second conductivity type). The drift region 120 and the body region 130 may each be formed in the second conductivity type well 110. The drift region 120 and the body region 130 may be arranged in a direction parallel to an upper surface of the semiconductor substrate 100 (for example, a lateral direction).

For example, the semiconductor substrate 100 may include a second conductivity type semiconductor substrate (e.g. a semiconductor substrate of the second conductivity type) such as a silicon substrate, a germanium substrate, or a silicon-germanium substrate. In some embodiments, the semiconductor substrate 100 may be provided as a Silicon-On-Insulator (SOI) substrate or a Germanium-On-Insulator (GOI) substrate.

The drift region 120 and the body region 130 may extend to an upper surface of the semiconductor substrate 100, for example, an upper surface of the second conductivity type well 110. In an example embodiment, the body region 130 may be adjacent to the drift region 120 to share a boundary therewith. However, the present invention it is not necessarily limited to this particular arrangement, and the body region 130 and the drift region 120 may be spaced apart from each other and disposed in the second conductivity type well 110.

A barrier region 102 may be further disposed between a lower region of the semiconductor substrate 100 and the second conductivity type well 110. The barrier region 102 may have an impurity concentration that is higher than that of the lower region of the semiconductor substrate 100 and/or the second conductivity type well 110. For example, the barrier region 102 may have the first conductivity type impurity.

A source region 135 having the first conductivity type may be formed in the body region 130, for example, one region away from an upper surface of the body region 130. Moreover, a body contact region 132 having the second conductivity type may be formed in the body region 130, for example, one region away from an upper surface of the body region 130. The body contact region 132 and the source region 135 may be in contact with each other. The source region 135 and the body contact region 132 are in contact with each other in the one direction, and the source region 135 may be closer to the drift region 120 or the channel region inside the body region 130, as compared with the body contact region 132.

In the drift region 120, a drain region 145 having the first conductivity type may be in contact with an opposite side to the body region 130. The drain region 145 may be formed in one region from an upper surface of the drift region 120. For example, the drain region 145 may be disposed opposite to the body region 130 in the one direction. The drain region 145 may be formed in the drift region 120 as illustrated in FIGS. 2A and 2B. Alternatively, the drain region may be in contact with the drift region 120 beyond an opposite side to the drift region 120.

As in an example embodiment, a first conductivity type drain well 140 may be formed opposite to the drift region 120. The drain region 145 may be formed in the drain well 140.

A drain isolation insulating film 160 may be disposed on the drift region 120. The drain isolation insulating film 160 may be formed in a drift region 120 between the gate electrode 155 and the drain region 145. The drain isolation insulating film 160, employed in an example embodiment, may be a Local Oxidation of Silicon (LOCOS). In an example embodiment, the drain isolation insulating film 160 may be a Shallow Trench Isolation (STI) (see FIG. 8).

The drain isolation insulating film 160 may mitigate current concentration between the gate electrode 155 and the drain region 145, thereby ensuring a stable breakdown voltage and increasing high voltage resistance. Moreover, the drain isolation insulating film 160 may remove a resistance (for example, an on-resistance (Ron)) increasing phenomenon caused by current bypass between the gate electrode 155 and the drain region 145. Thus, a semiconductor device 10A may be implemented, in which a predetermined breakdown voltage is secured, while resistance is reduced to have the increased operating speed.

The gate electrode 155 may be formed on the semiconductor substrate 100 and may extend over both a portion of the body region 130 and a portion of the drift region 120. The gate electrode 155 may extend from the body region 130 to the drift region 120. A portion of the gate electrode 155 may be formed on the drain isolation insulating film 160. The gate electrode 155 may selectively extend over a portion of the source region 135. For example, the gate electrode 155 may include polysilicon. In some example embodiments, the gate electrode 155 may include a conductive material such as a metal, a metal nitride, a metal silicide, and/or the like.

The gate electrode 155 may have at least one closed-type opening. As used herein, the phrase "closed-type opening" is meant to convey that while the openings may penetrate through a full thickness of the gate electrode 155, they do not separate the gate electrode into discrete sections. Rather, because the diameter of the closed-type opening is smaller than the planar length and width of the gate electrode 155, the gate electrode 155 remains undivided, and in this sense, the gate electrode 155 remains "closed" around the circumference of the closed-type opening so that the closed-type opening is like a pore within the gate electrode 155.

The at least one closed-type opening OG may have a region overlapping the drift region 120, and a portion of the gate insulating film 151 may be exposed. In an example embodiment, at least one closed-type opening OG may include a plurality closed-type openings (for example, two openings). The plurality of closed-type openings OG may be arranged in another direction (for example, a second direction) intersecting the one direction (for example, a first direction) (for example, a direction in which the body region 130, the drift region 120, and the drain region 145 are arranged) between the body region 130 and the drain region 145.

Where there are multiple closed-type openings OG, the closed-type openings OG are separated from one another by the gate electrode 155 and so the gate electrode 155 remains a singular undivided structure.

The opening OG, employed in an example embodiment, has a closed type structure, which is not open at an edge of a gate electrode (e.g. the opening OG does not extend to the planar edges of the gate electrode in a plan view. Thus, an integrated electrode structure of the gate electrode 155 may be maintained while the gate electrode is not divided into a plurality of electrode regions, as illustrated in FIG. 1. As described above, while the integrated electrode structure of the gate electrode 155 is maintained, an area of the gate electrode 155 may be reduced due to the closed-type opening OG.

As the area of the gate electrode 155 is reduced, parasitic capacitance such as gate input capacitance Cgg and gate to drain capacitance Cgd may be reduced. In detail, the semiconductor device 10A, for example, the parasitic capacitance of the power MOS transistor may be proportional to the product of an overlap length between the gate electrode and the gate insulating film (or an effective length of the gate electrode) and a width of the transistor. According to the related art, the width of the transistor is a value determined according to an on-resistance (Ron) value of the power MOS transistor used for switching mode power supply (SMPS). In this regard, to reduce the parasitic capacitance (for example, Cgg), an effective length of the gate electrode 155 is reduced. However, the reduction in the effective length may allow the reduction in the hot carrier characteristics. While the width of the transistor and the effective length of the gate electrode 155 are maintained, the closed-type opening OG is introduced to reduce the parasitic capacitance is reduced, thereby reducing switching loss. Accordingly, the function of the closed-type opening OG is to reduce the area of the gate electrode 155 without having to reduce the length or width of the gate electrode 155.

In a plan view, the total area of the closed-type opening OG may be formed to have a range of 20% to 80%, more preferably, 30% to 60% to the outer reference area of the gate electrode 155. For example, a ratio between a total area of the closed-type opening OG and an actual area of the gate electrode 155 may be within a range of 2:8 to 8:2.

The closed-type opening OG, employed in an example embodiment, may be processed to allow the inner corner thereof to have an obtuse angle. For example, the closed-type opening is processed to allow the inner corner thereof to have an angle greater than 90° (for example, 120°), so an electric field may be dispersed. In an example embodiment, the inner corner of the closed-type opening OG may have a rounded portion to allow an electric field to be effectively dispersed. Thus, the closed-type opening OG may have a shape of a cylinder, a prism, or some other related shape.

A gate insulating film 151 may be disposed in a lower portion of the gate electrode 155. The gate insulating film 151 and the gate electrode 155 may be stacked sequentially on the semiconductor substrate 100. The gate insulating film 151 may have a portion 151E extended to the body region 130 and the drain region 145, but the present invention is not necessarily limited thereto, and the gate insulating film 151 may be patterned to correspond to the gate electrode 155.

For example, the gate insulating film 151 may be formed using a deposition process or a thermal oxidation process. When the gate insulating film 151 is formed using the deposition process, the gate insulating film 151 may be formed on the drain isolation insulating film 160. In an example, when the gate insulating film 151 is formed using the thermal oxidation process, the gate insulating film 151 might not be formed on the drain isolation insulating film 160. Moreover, even when the gate insulating film 151 is formed on the drain isolation insulating film 160, if the gate insulating film and the drain isolation insulating film are formed of the same material or similar materials, it may be seen that the gate insulating film 151 and the drain isolation insulating film 160 are integrally formed without being distinguished. For example, the gate insulating film 151 may include silicon oxide, silicon nitride, or silicon oxynitride.

A gate spacer 156 may be formed on a side surface of the gate electrode 155. The gate spacer 156 may include, for example, silicon oxide or metal oxide.

An interlayer insulating film 170 is formed on the semiconductor substrate 100 and may cover the gate insulating film 151 as well as the gate electrode 155. The interlayer insulating film 170 may include, for example, a silicon oxide-based material such as a Plasma Enhanced Oxide (PEOX), TetraEthyl OrthoSilicate (TEOS), or Flowable Oxide (FOX)-based material.

A source contact plug 180S and a drain contact plug 180D each pass through both the interlayer insulating film 170 and the gate insulating film 151, and the source contact plug 180S and the drain contact plug 180D may be electrically connected to the source region 135 and the drain region 145, respectively (see FIG. 2B). In an example embodiment, the source contact plug 180S may also be electrically connected to the body contact region 132 together with the source region 135. In a similar manner, the gate contact plug 180G may penetrate the interlayer insulating film 170 to be electrically connected to a portion of the gate electrode 155 (see FIG. 2A). At least one among the source contact plug 180S, the drain contact plug 180D, and the gate contact plug 180G may include a conductive material, for example, a metal such as tungsten, copper, and/or aluminum, a metal nitride, and/or doped polysilicon.

In an example embodiment, a common bias may be applied to a source region 135 electrically connected to the source contact plug 180S in the source region 135 and the body contact region 132. In some embodiments, an additional contact plug is formed in the source region 135 and the body contact region 132, so an additional bias may be applied.

A metal silicide layer 185 is disposed both between the source contact plug 180S and the source region 135/the body contact region 132, and between the drain contact plug 180D and the drain region 145, to lower contact resistance (see FIG. 2B). The metal silicide layer 185 may be formed from an exposed semiconductor region of the source region 135/the body contact region 132, and the drain region 145.

The gate electrode 155 may include undoped polysilicon or doped polysilicon. The doped polysilicon may be doped with n-type (n+ or n−) or p-type (p+ or p−) impurities. When the gate electrode 155 is polysilicon, a metal silicide layer 185 may be formed between the gate contact plug 180G and the gate electrode 155 (see FIG. 2A).

The source region 135, the body region 130, the drain region 145, the gate electrode 155, and the drift region 120 may together constitute a power MOS transistor. The semiconductor device 10A, according to an example embodiment, may have a Laterally Diffused Metal Oxide Semiconductor (LDMOS) structure. The semiconductor device 10A may include a device isolation portion 161 having STI. The power MOS transistor region may be defined by the device isolation portion 161.

The first conductivity type may be n-type or p-type, while the second conductivity type may be p-type or n-type. When the first conductivity type is n-type, and the second conductivity type is p-type, the power MOS transistor, formed in the semiconductor device 10A, may be an n-type power MOS transistor. When the first conductivity type is p-type, and the second conductivity type is n-type, the power MOS transistor, formed in the semiconductor device 10A, may be a p-type power MOS transistor.

For example, when the power MOS transistor, formed in the semiconductor device 10A, is the n-type power MOS transistor, the semiconductor substrate 100 is p-type and may have an impurity concentration of about $1\times10^{14}$ to $1\times10^{16}/cm^3$, and the barrier region 102 is p-type or n-type and may have an impurity concentration of about $1\times10^{19}/cm^3$ or more. The second conductivity type well region is p-type and may have an impurity concentration of about $1\times10^{15}$ to $1\times10^{17}/cm^3$, the drift region 120 is n-type and may have an impurity concentration of about $1\times10^{15}$ to $1\times10^{17}/cm^3$, and the body region 135 is p-type and may have an impurity concentration of about $1\times10^{16}$ to $1\times10^{18}/cm^3$. The drain well 140 is n-type and may have an impurity concentration that is higher than an impurity concentration of the drift region 120, for example, an impurity concentration of about $2\times10^{15}$ to $1\times10^{18}/cm^3$. The body contact region 132, the source region 135, and the drain region 145 are p-type, n-type, and n-type, respectively, and may have an impurity concentration of about $10^{19}/cm^3$ or more.

When a negative bias is applied to the gate electrode 155, depletion occurs in a drift region 120, so the drain region 145 may be expanded. Thus, in the power MOS transistor, formed in the semiconductor device 10A, a current flow path may be formed, in which a current flows through a lower side of a drift region 120 in a lower portion of the drain isolation insulating films 160.

For example, when the power MOS transistor, formed in the semiconductor device 10A, is a p-type power MOS transistor, conductivity of respective components may be selected and formed in the opposite manner to the case of an n-type power MOS transistor.

Figure 3:
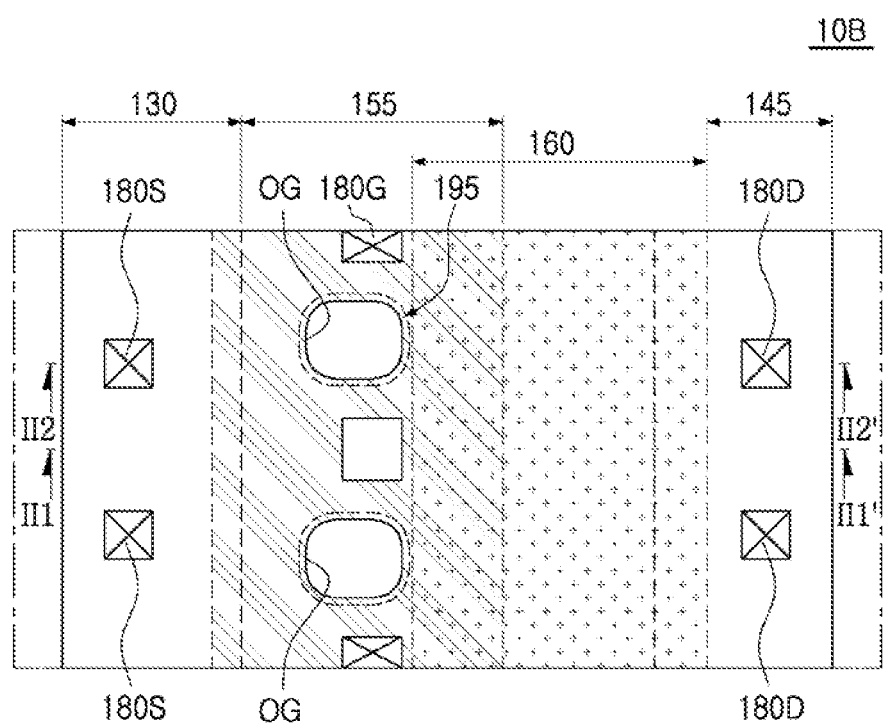
FIG. 3 is a plan view illustrating a semiconductor device according to an example embodiment of the present disclosure.
Figure 4A:
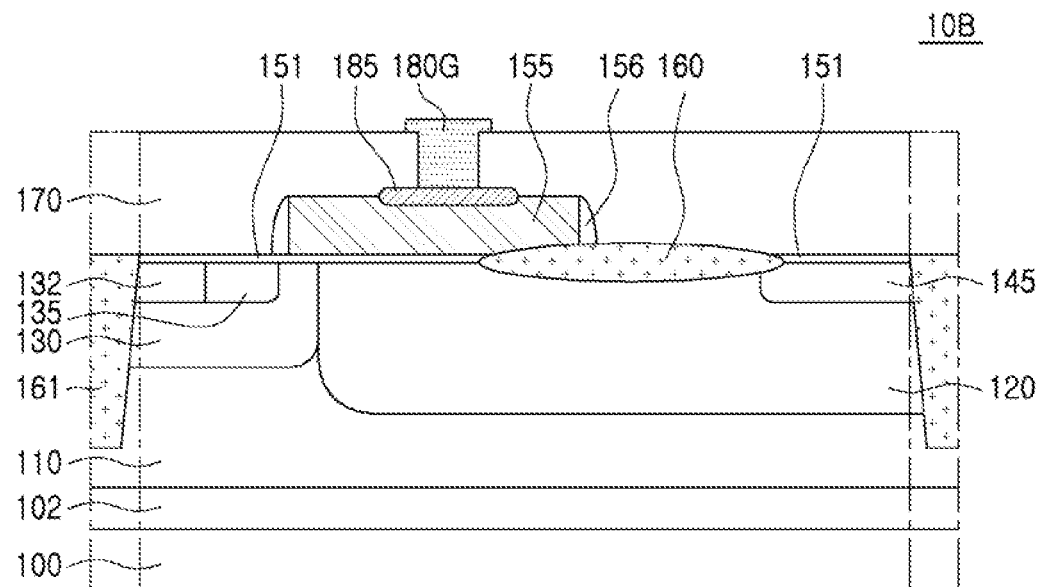
FIGS. 4A and 4B are cross-sectional views illustrating the semiconductor device of FIG. 2 taken along lines II1-II1' and II2-II2'.
Figure 4B:
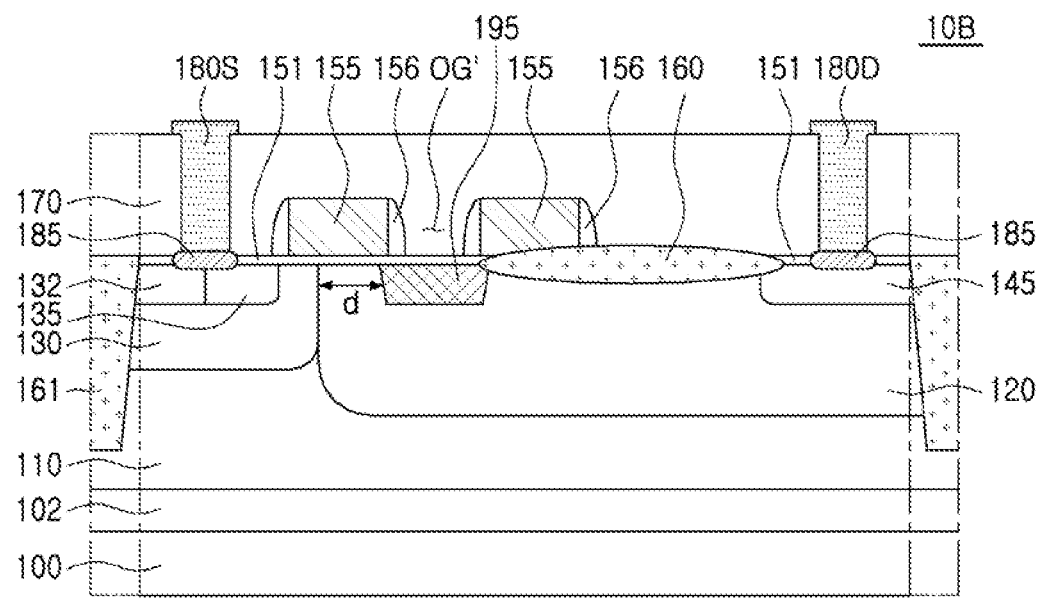

FIG. 3 is a plan view illustrating a semiconductor device according to an example embodiment of the present disclosure, and FIGS. 4A and 4B are cross-sectional views of the semiconductor device of FIG. 2 taken along lines II1-II1' and II2-II2'.

Referring to FIGS. 3, 4A, and 4B, a semiconductor device 10B, according to an example embodiment, may be understood as a structure similar to that of an example embodiment illustrated in FIGS. 1, 2A, and 2B, except that a first conductivity type impurity region 195 is additionally formed in a drift region 120 overlapping a closed-type opening OG, an inner corner of the closed-type opening OG has a rounded portion, and a drain well is not employed. Thus, a description of an example embodiment illustrated in FIGS. 1, 2A, and 2B may be combined with the description provided below, unless otherwise stated.

The semiconductor device 10B may include a power MOS transistor in a similar manner to an example embodiment described previously. However, in a semiconductor device 10B, according to an example embodiment, while a drain well (140 of FIG. 2A) is not employed, a drain region 145 may be directly formed at an impurity concentration (for example, about $10^{19}/cm^2$ or more) that is higher than an impurity concentration of the drift region 120 inside the drift region 120.

Meanwhile, the semiconductor device 10B, according to an example embodiment, may further include a first conductivity type impurity region 195 disposed in a region overlapping the closed-type opening OG. The first conductivity type impurity region 195 may have an impurity concentration that is greater than an impurity concentration of the drift region 120. For example, the drift region 120 is n-type and may have an impurity concentration of about $1\times10^{15}$ to $1\times10^{17}/cm^3$, while the first conductivity type impurity region 195 is n-type and may have an impurity concentration of about $2\times10^{15}$ to $1\times10^{18}/cm^3$.

As described previously, in order to reduce an effective length (or an area) of the gate electrode 155, the closed-type opening OG is formed. Accordingly, hot carrier SOA characteristics may be reduced. To compensate for the reduction, a first conductivity type impurity region 195 may be additionally introduced.

An effective length of the gate electrode 155 may be determined according to the sum of a channel length and a drain overlap length (Ldov). Here, the channel length determines a threshold voltage Vth of a power MOS transistor and leakage characteristics, and the drain overlap length determines hot carrier reliability, in addition to parasitic capacitance Cgd. Thus, due to the introduction of the closed-type opening OG, the parasitic capacitance may be reduced, but hot carrier characteristics, a main reliability factor of the power MOS transistor may be adversely affected.

As in an example embodiment, in order to increase the hot carrier characteristics, a first conductivity type impurity region 195 may be formed through a closed-type opening OG to increase an impurity concentration of the drift region 120 below the gate electrode 155. In the first conductivity type impurity region 195, after ion implantation, through a diffusion process, a portion of the first conductivity type impurity region 195 may be located below the gate electrode 155.

Although the first conductivity type impurity region 195 is expanded by the diffusion process, the first conductivity type impurity region may be spaced apart from the body region 130. A distance "d" between the first conductivity type impurity region 195 and the body region 130 may be within a range of from 0.1 μm to 0.3 μm, or may be more than 0.3 μm.

The closed-type opening OG, employed in an example embodiment, may be processed to allow an inner corner thereof to have a rounded portion. Since an angles portion of the inner corner of the closed-type opening OG is replaced with a rounded portion, an electric field could be effectively dispersed.

Characteristics of a power MOS transistor, according to an example embodiment of the present disclosure, and a power MOS transistor having a structure according to the related art were measured, compared, and evaluated. The power MOS transistor (Example), according to an example embodiment of the present disclosure, and a power MOS transistor (Comparative Example), having a structure according to the related art, are manufactured to have the same structure. Here, as illustrated in FIGS. 3, 4A, and 4B, it is different in that a gate electrode includes a closed-type opening and a first conductivity type impurity region is formed through the closed-type opening, and each of parasitic capacitance, breakdown voltage, and resistance characteristics of the power MOS transistor were measured.

Figure 5A:
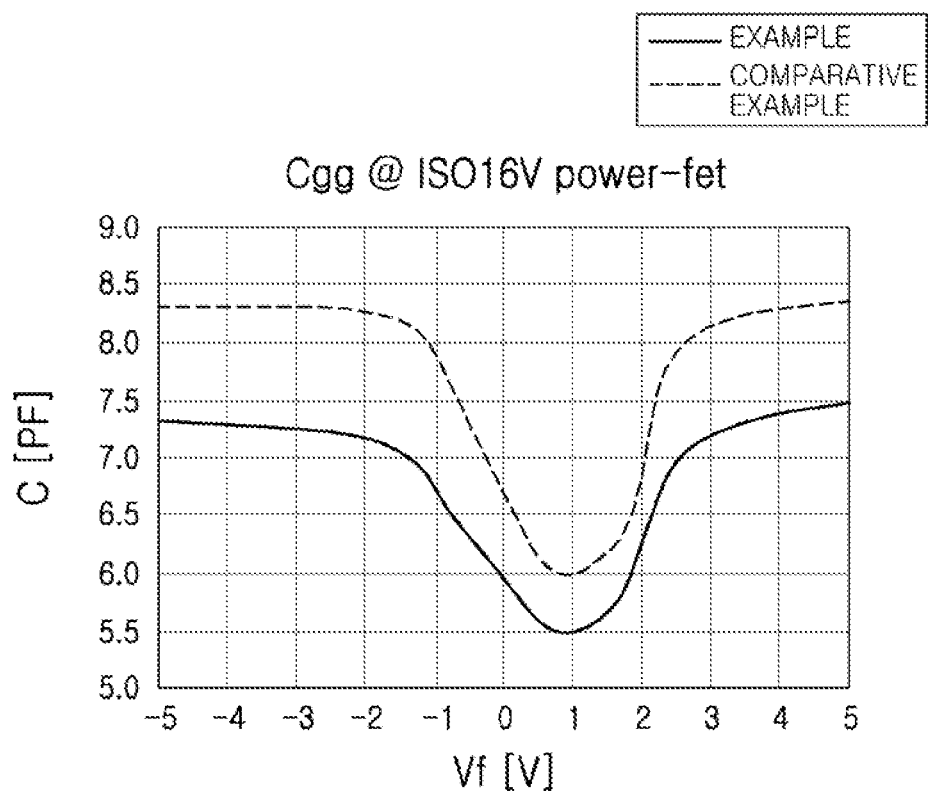
FIGS. 5A and 5B are graphs illustrating and comparing parasitic capacitance (Cgg and Cgd) of a power MOS transistor according to an example and a comparative example of the present disclosure.
Figure 5B:
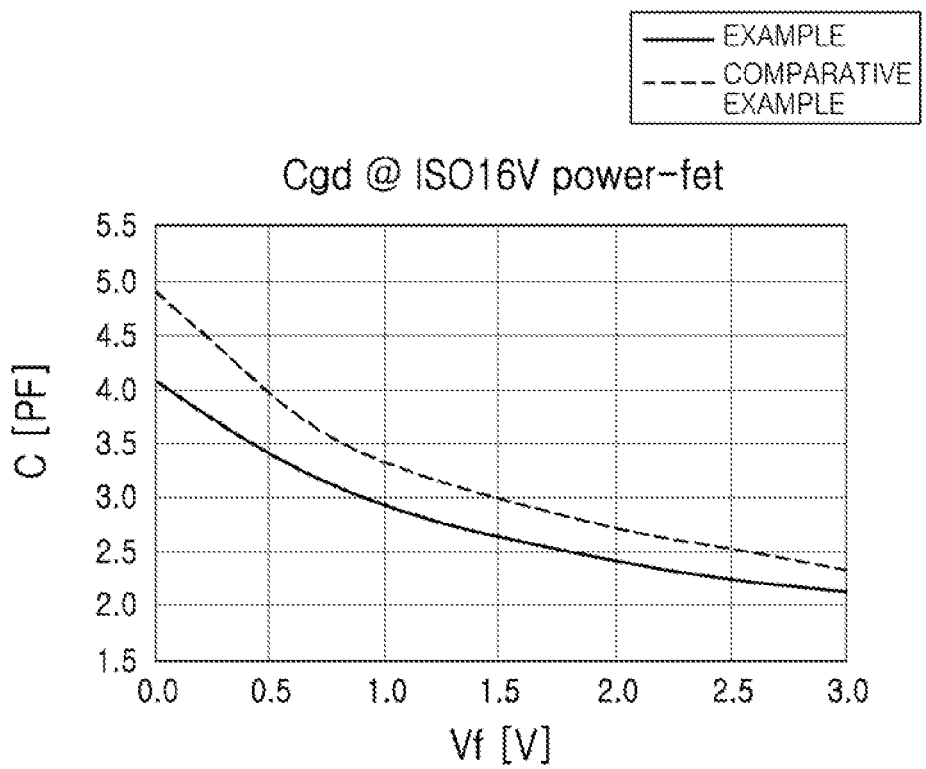

FIGS. 5A and 5B are graphs illustrating and comparing parasitic capacitance (Cgg and Cgd) of a power MOS transistor according to an example and a comparative example of the present disclosure.

Referring to FIGS. 5A and 5B, due to the introduction of the closed-type opening of the power MOS transistor according to an example, as compared with the power MOS transistor according to a comparative example, it can be seen that the gate to drain capacitance Cgd as well as the gate input capacitance Cgg are reduced by about 10% to 20%. As described above, it may be understood that, a gate electrode length for formation of a channel is reduced to reduce the gate input capacitance Cgg, and the drift overlap length is reduced to reduce the gate to drain capacitance Cgd.

Figure 6A:
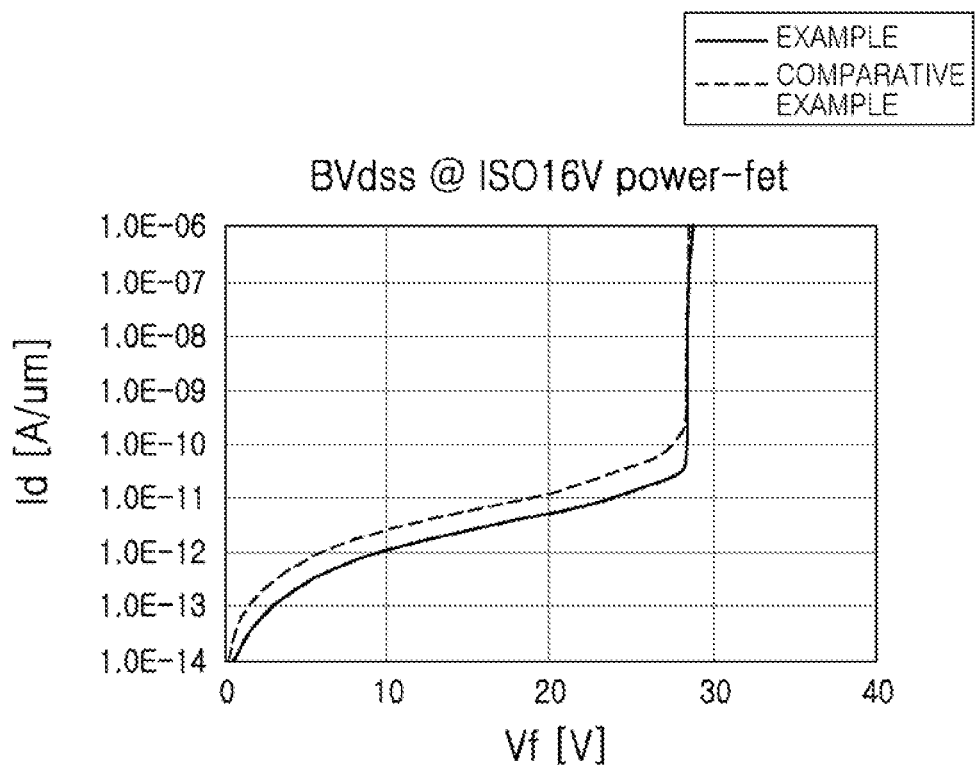
FIGS. 6A and 6B are graphs illustrating and comparing BV characteristics and resistance characteristics (Rsp) of a power MOS transistor according to an example and a comparative example of the present disclosure.
Figure 6B:
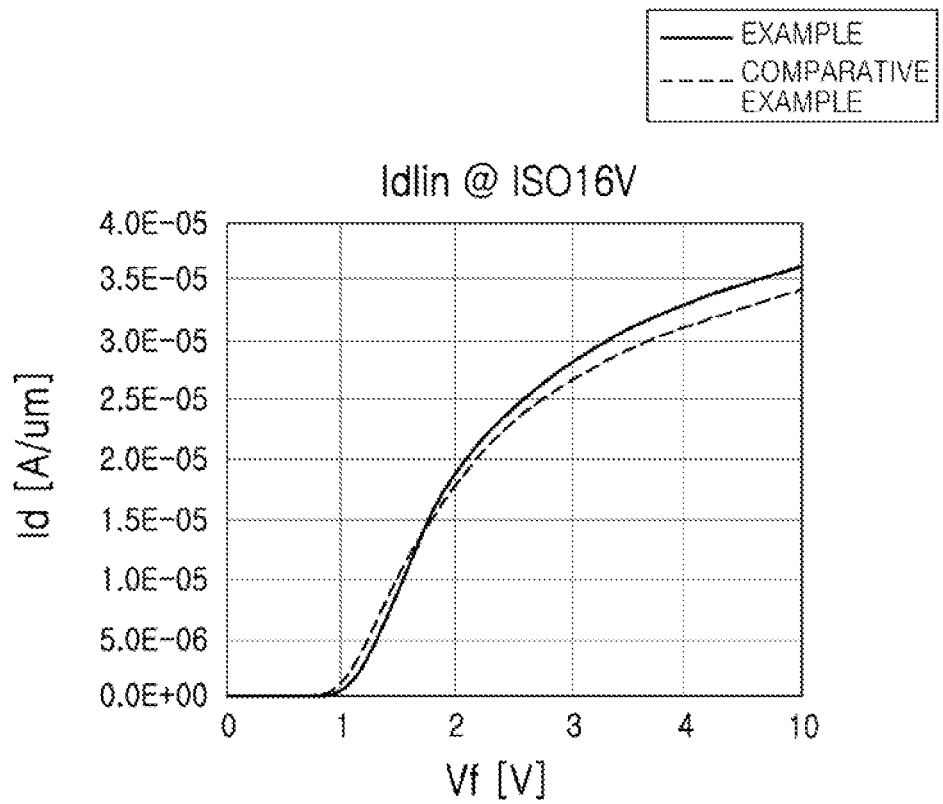
Figure 7:
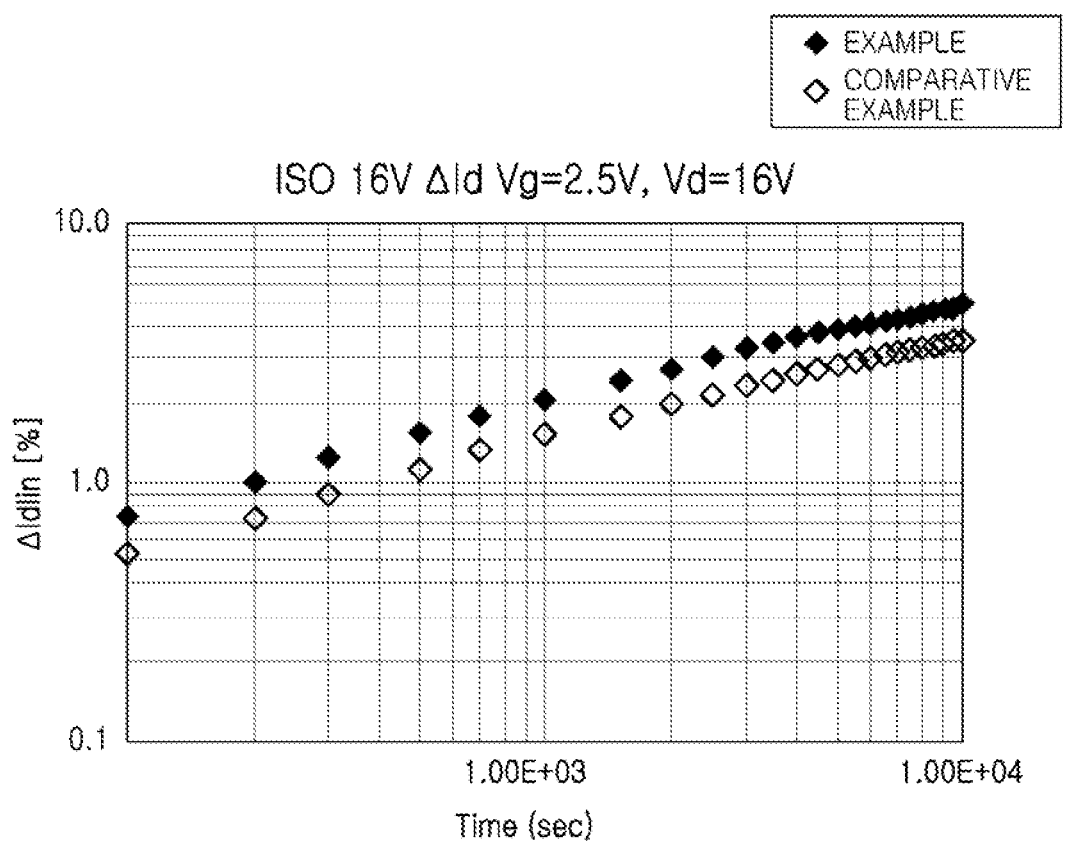
FIG. 7 includes graphs illustrating and comparing hot carrier injection reliability of a power MOS transistor according to an example and a comparative example of the present disclosure.

FIGS. 6A and 6B are graphs illustrating and comparing BV characteristics and resistance characteristics Rsp of a power MOS transistor according to an example and a comparative example of the present disclosure, and FIG. 7 includes a graph illustrating and comparing hot carrier injection reliability of a power MOS transistor according to an example and a comparative example of the present disclosure.

Referring to FIGS. 6A and 6B, in a power MOS transistor, according to an example, despite the introduction of the closed-type opening, it may be confirmed that a characteristic level of the power MOS transistor, according to a comparative example, is maintained without significant change in the view of the breakdown voltage side and the resistance characteristic (Rsp).

Referring to FIG. 7, it may be confirmed that there is no significant change in hot carrier injection reliability in a similar manner to breakdown voltage characteristics, or the like.

As described above, in an example embodiment, it can be understood that the hot carrier characteristics are maintained by forming a first conductivity type impurity region through a closed-type opening to increase an impurity concentration below a gate electrode in order to maintain hot carrier characteristics while reducing parasitic capacitance due to the introduction of a closed-type opening.

Figure 8:
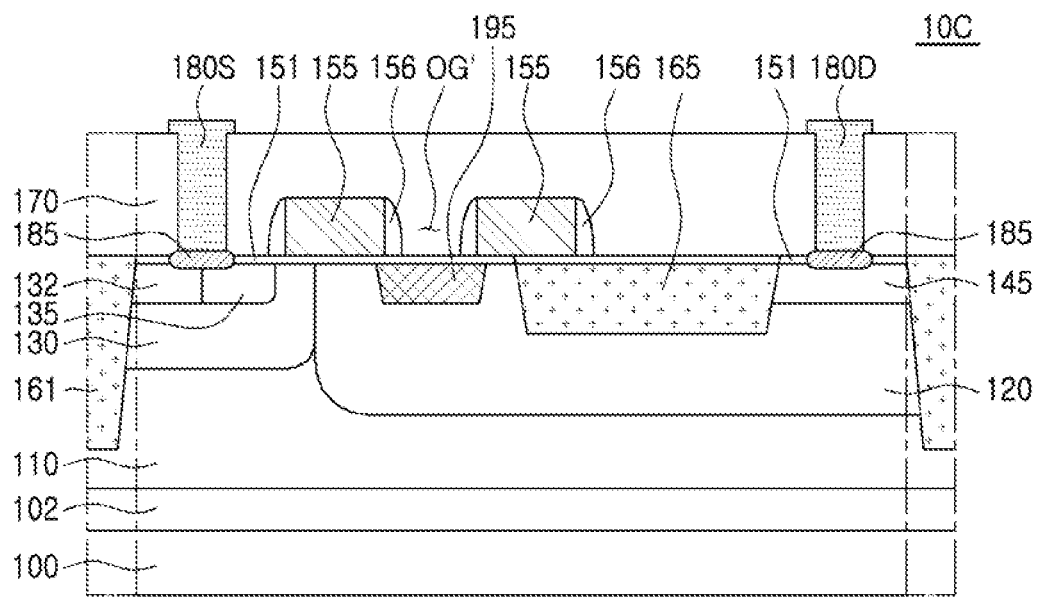
FIG. 8 is a cross-sectional view illustrating a semiconductor device according to an example embodiment of the present disclosure.

FIG. 8 is a cross-sectional view illustrating a semiconductor device according to an example embodiment of the present disclosure.

Referring to FIG. 8, a semiconductor device OC, according to an example embodiment, may be understood as a structure similar to that of an example embodiment illustrated in FIGS. 1, 2A, and 2B, except that a drain isolation insulating film 165 is employed to have a STI structure, a first conductivity type impurity region 195 is additionally formed in a drift region 120 overlapping a closed-type opening OG, an inner corner of the closed-type opening OG has a rounded portion, and a drain well is not employed. Thus, a description of an example embodiment illustrated in FIGS. 1, 2A, and 2B may be combined with the description below, unless otherwise stated.

The semiconductor device 10C may include a power MOS transistor having a similar structure to that of the semiconductor device 10B illustrated in FIG. 4B. In the semiconductor device 10C, a drain well (140 of FIG. 2A) is not employed, and a drain region 145 may be directly formed in the drift region 120.

The drain isolation insulating film 165, employed in an example embodiment, may have a STI structure. For example, a trench is formed in an upper portion of the drift region 120, a trench 116 is filled with an insulating material such as silicon oxide, and then, an upper portion of the insulating film is flattened through a chemical mechanical polishing (CMP) process to form an STI structure for the drain isolation insulating film 165. The drain isolation insulating film 165 may be formed together with a device isolation portion 161 having the same/similar STI structure.

In a manner similar to the semiconductor device 10B illustrated in FIG. 4B, the semiconductor device 10C, according to an example embodiment, may further include a first conductivity type impurity region 195 disposed in a region overlapping the closed-type opening OG. The first conductivity type impurity region 195 may have an impurity concentration that is greater than an impurity concentration of the drift region 120. Although an effective length (or an are) of the gate electrode 155 is reduced by the introduction of the closed-type opening OG, hot carrier characteristics may be maintained due to the first conductivity type impurity region 195.

As described previously, below the gate electrode 155, in order to increase an impurity concentration of the drift region 120, a first conductivity type impurity region 195 may be formed through the closed-type opening OG. In the first conductivity type impurity region 195, after ion implantation, through a diffusion process, a portion of the first conductivity type impurity region 195 may be located below the gate electrode 155.

Figure 9A:
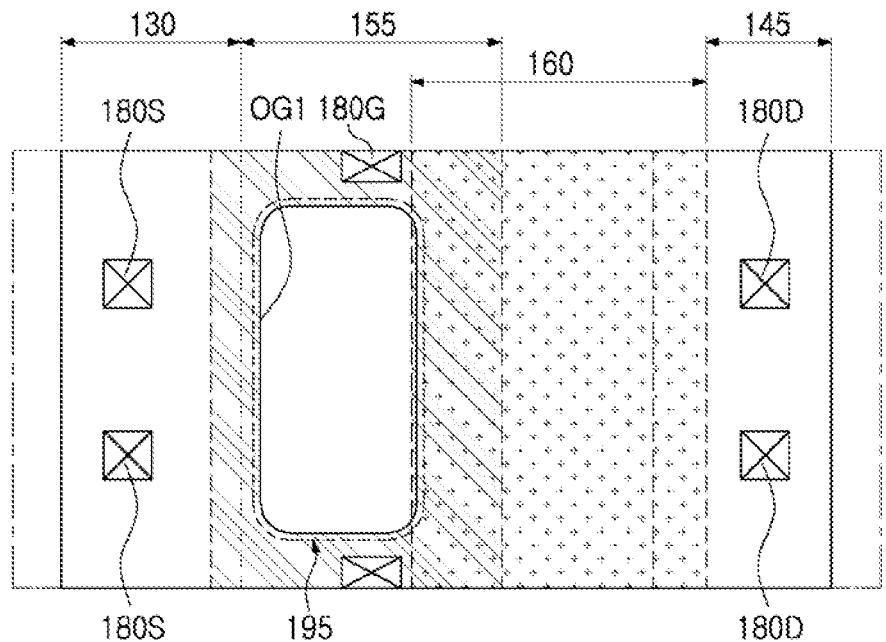
FIGS. 9A to 9C are plan view illustrating a semiconductor device according to various example embodiments of the present disclosure.
Figure 9B:
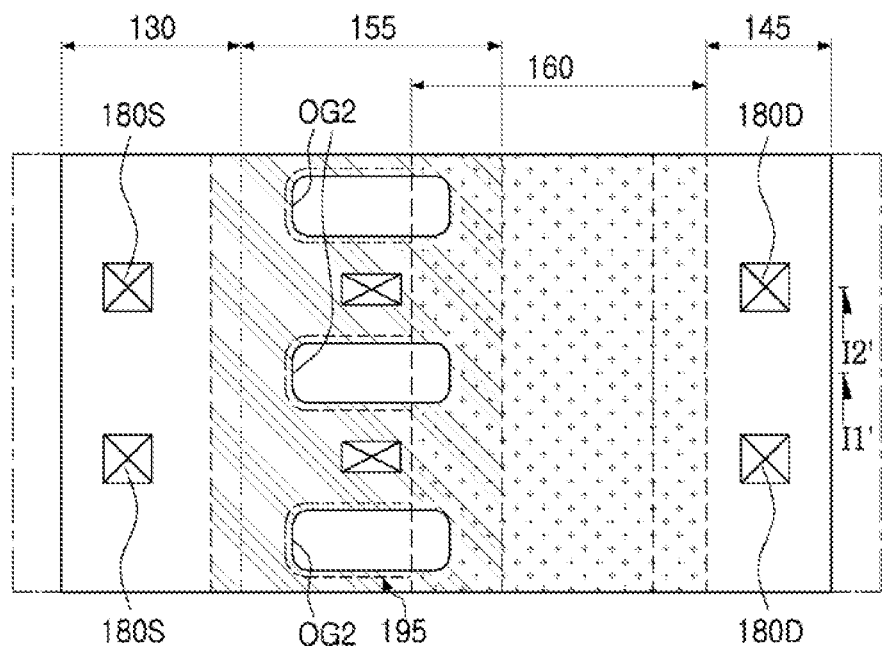
Figure 9C:
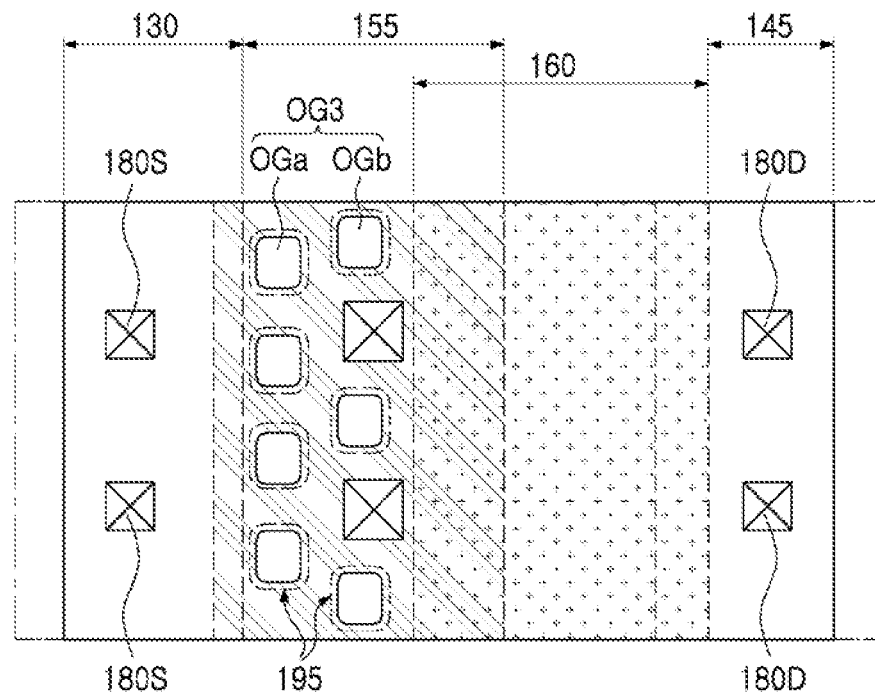

The closed-type opening OG, according to an example embodiment, may have various shapes and sizes, and various arrangements may be provided. FIGS. 9A to 9C are plan views illustrating semiconductor devices having closed-type openings in various arrangements.

A layout, illustrated in each of FIGS. 9A to 9C, may be understood to be the same as a similar layout according to an example embodiment illustrated in FIG. 1, except for the arrangement of the closed-type opening OG. Thus, a description of an example embodiment illustrated in FIGS. 1, 2A, and 2B may be combined with the description provided below, unless otherwise stated.

Referring to FIG. 9A, a semiconductor device, according to an example embodiment, may include a single closed-type opening OG1 formed in a gate electrode 155.

The closed-type opening OG1, employed in an example embodiment, has a relatively wide area, and may have a quadrangular shape extended in a width direction of a device. An inner corner of the closed-type opening OG1 may have a rounded portion to aid in electric field dispersion. A first conductivity type impurity region 195 may be formed using an ion implantation/diffusion process in a drift region (120 of FIG. 2B) overlapping the closed-type opening OG1.

Referring to FIG. 9B, a semiconductor device, according to an example embodiment, may include three closed-type openings OG2 formed in a gate electrode 155.

The closed-type opening OG2, employed in an example embodiment, may have a quadrangular shape extended in a direction (hereinafter, a first direction), in which a body region 130, a drift region (120 of FIG. 2B), and a drain region 145 are arranged. The three closed-type openings OG3 may be arranged in a second direction intersecting the first direction between the body region 130 and the drain region 145.

An inner corner of the closed-type opening OG2 may have a rounded portion to aid in electric field dispersion, in a similar manner to an example embodiment described above. Moreover, a first conductivity type impurity region 195 may be formed using an ion implantation/diffusion process in a drift region (120 of FIG. 2B) overlapping the closed-type opening OG2. In an example embodiment, since a portion of the closed-type opening OG2 is located on the drain isolation insulating film 160, the first conductivity type impurity region 195 might not be formed in a portion provided with the drain isolation insulating film 160 except for a diffused portion.

Referring to FIG. 9B, a semiconductor device, according to an example embodiment, may include a plurality of closed-type openings OG3 formed in a gate electrode 155.

Each closed-type opening OG3, employed in an example embodiment, may be arranged in two rows in a second direction intersecting the first direction between the body region 130 and the drain region 145. An inner corner of the closed-type opening OG3 may have a rounded portion to aid in electric field dispersion, in a similar manner to an example embodiment described above. Moreover, a first conductivity type impurity region 195 may be formed using an ion implantation/diffusion process in a drift region (120 of FIG. 2B) overlapping the closed-type opening OG3. In some embodiments, although a closed-type opening is divided into a plurality of closed-type openings, when the closed-type openings are arranged adjacent to each other, the first conductivity type impurity region may be connected to each other in a process of diffusion.

FIGS. 10 and 11A to 13A are cross-sectional views (II1-II1') of a main process to describe a method of manufacturing a semiconductor device 10B according to an example embodiment of the present disclosure, and FIGS. 11B to 13B are cross-sectional views (II2-II2') of a main process to describe a method of manufacturing a semiconductor device according to an example embodiment of the present disclosure.

Figure 10:
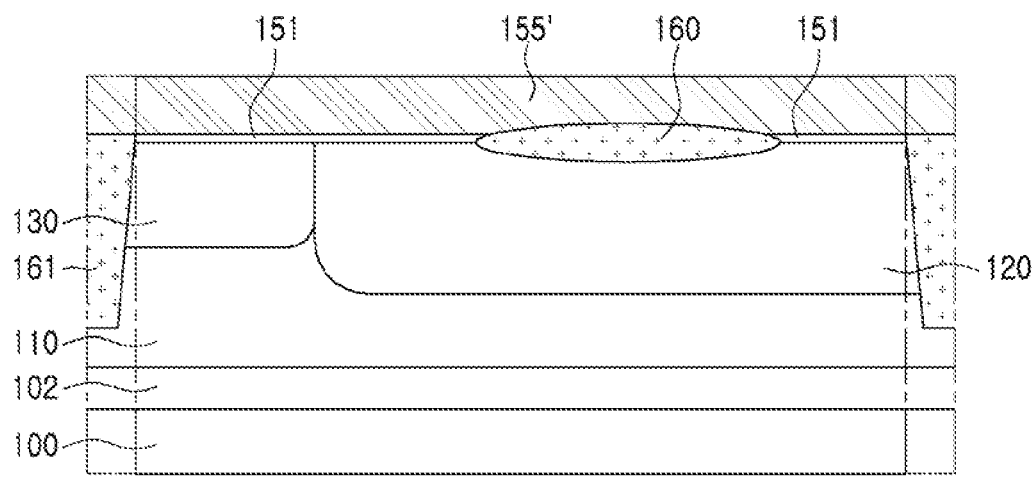
FIGS. 10 and 11A, 11B, 12A, 12B and 13A are cross-sectional views (II1-II1') illustrating a method of manufacturing a semiconductor device according to an example embodiment of the present disclosure.

Referring to FIG. 10, a gate electrode material layer is formed on a semiconductor substrate formed in a body region and a drift region.

A semiconductor substrate 100 may be provided as a silicon substrate, a germanium substrate, a silicon-germanium substrate, a SOI substrate, a GOI substrate, or the like. In some embodiments, for example, an epitaxial layer, formed using an epitaxial growth process from a silicon substrate or a germanium substrate, may be used as the semiconductor substrate 100. A transistor region is defined by a device isolation portion 161, and a second conductivity type well 110, a first conductivity type drift region 120, and a second conductivity type body region 130 may be formed using an ion implantation process on an upper portion of the semiconductor substrate 100. For example, the first conductivity type impurity includes N-type impurities such as phosphorus or arsenic, while the second conductivity type impurity includes P-type impurities such as boron.

A drain isolation insulating film 160 is formed on the semiconductor substrate 100, and then, a gate insulating film 151 and a gate electrode layer 155' may be formed sequentially. In an example embodiment, the drain isolation insulating film may have a LOCOS structure. The gate insulating film may be conformally formed. The gate insulating film 151 includes silicon oxide and is formed using a CVD process, by way of example, but may be formed using a thermal oxidation process as in an example embodiment. A gate electrode layer 155' includes undoped or doped polysilicon, but the present invention is not limited thereto. The gate electrode layer may include metal or metal nitride. For example, the gate electrode layer 155' may be formed using a sputtering process or an atomic layer deposition (ALD) process.

Figure 11A:
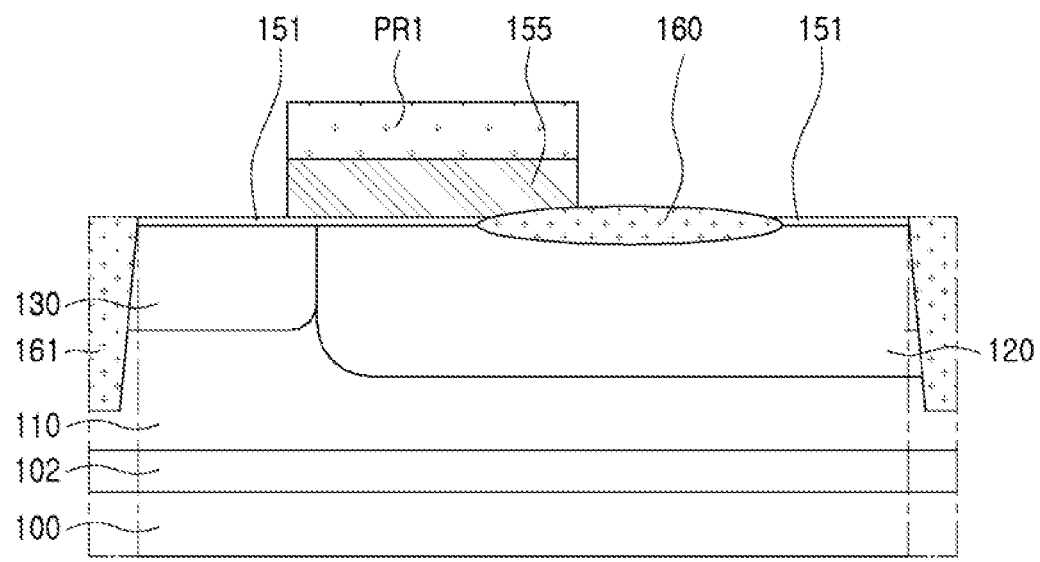
Figure 11B:
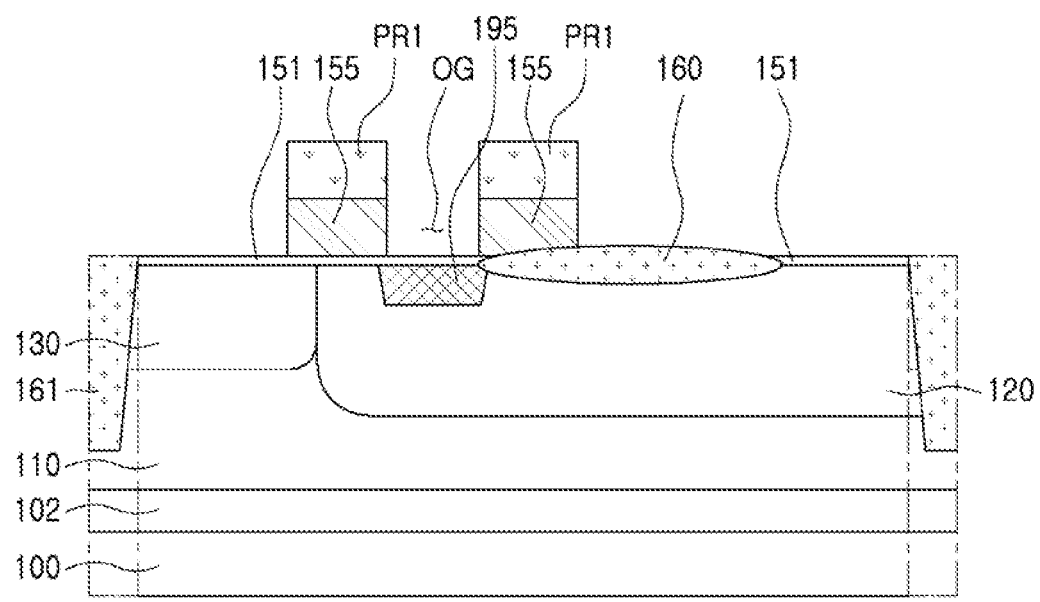

Referring to FIGS. 11A and 11B, a gate electrode layer 155' is partially etched using a first photoresist pattern PR1 to form a gate electrode 155.

In this process, the gate electrode 155 is formed over a portion of the first conductivity type drift region 120 and a portion of the second conductivity type body region 130, and a portion may be patterned to be located on a drain isolation insulating film 160. As illustrated in FIG. 1, the gate electrode 155 may extend in the second direction (for example, a width direction). In detail, as illustrated in FIG. 11B, the gate electrode 155 may be formed to have a closed-type opening OG, and a portion of the gate insulating film 151 may be exposed through the closed-type opening OG.

As in an example embodiment, when the gate electrode 155 includes polysilicon, the gate electrode 155 may be formed through a vapor phase etching process using chlorine gas, by way of example.

In addition, the first conductivity type impurity region 195 may be formed in a drift region overlapping the closed-type opening OG through an ion implantation/diffusion process. As described previously, hot carrier characteristics thereof may be increased due to the first conductivity type impurity region 195.

Figure 12A:
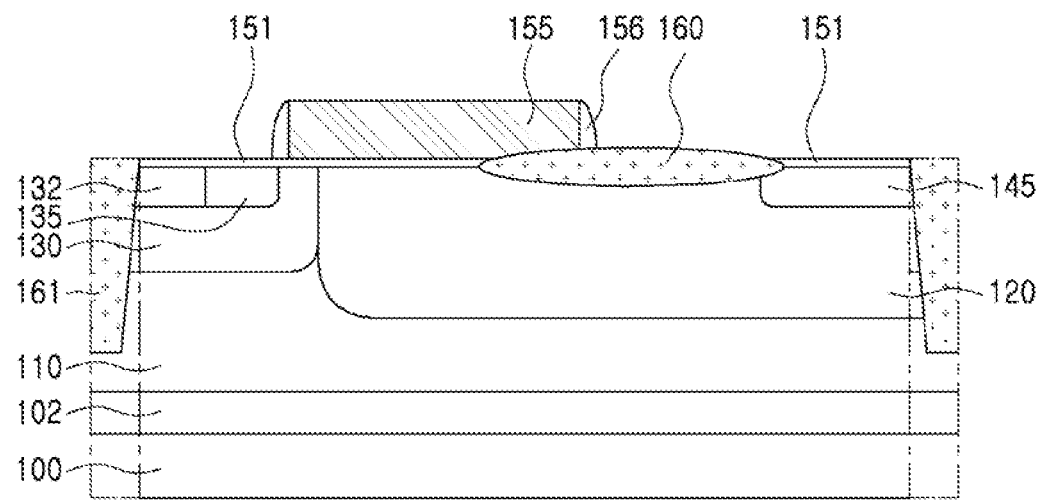
Figure 12B:
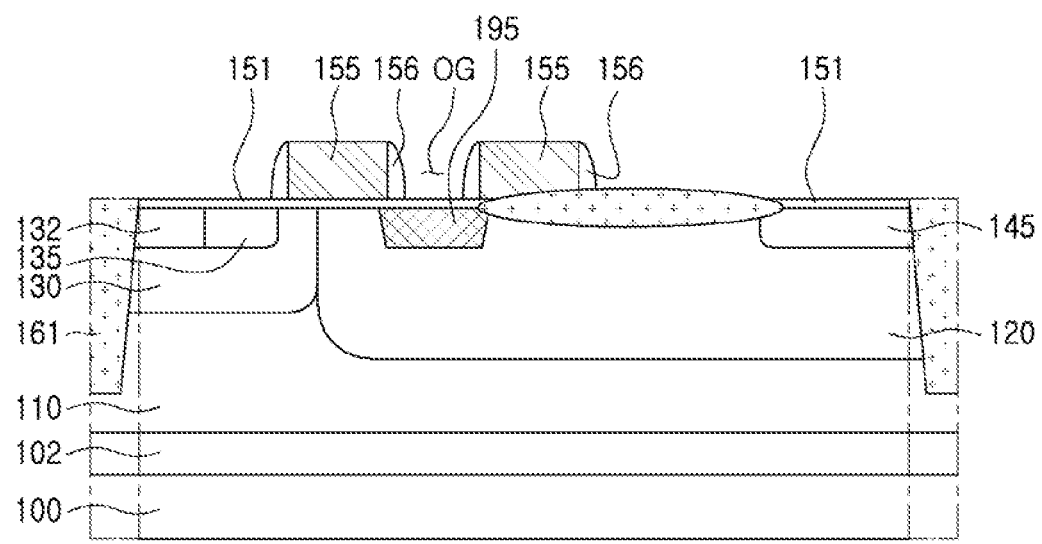

Referring to FIGS. 12A and 12B, source and drain regions 135 and 145, a body contact region 132, and a first conductivity type impurity region 195 are formed, and a spacer 156 for a gate electrode 155 may be formed.

Through an ion implantation process, first conductivity type impurities are implanted into an upper portion of the semiconductor substrate 100 to form the source region 135 and the drain region 145. The source region 135 and the drain region 145 may be provided as an N+ region. Alternatively, when the semiconductor device is manufactured as a P-type lateral double-diffused metal oxide semiconductor (P-LDMOS), the source region 135 and the drain region 145 may be provided as a P+ region. Second conductivity type impurities are implanted into an interior of the second conductivity type body region 130 to form the second conductivity type body contact region 132 in contact with the source region 135. The second conductivity type body contact region1 132 may be provided as a P+ region. Alternatively, when the semiconductor device is provided as a P-LDMOS, the second conductivity type body contact region 132 may be provided as an N+ region.

An insulating layer is deposited on the semiconductor substrate 100, and then, an anisotropic etching or etch back process is applied to form a spacer 156 on a side wall of the gate electrode 155. The spacer 156 may also be formed on an inner side wall surrounding the closed-type opening OG.

Figure 13A:
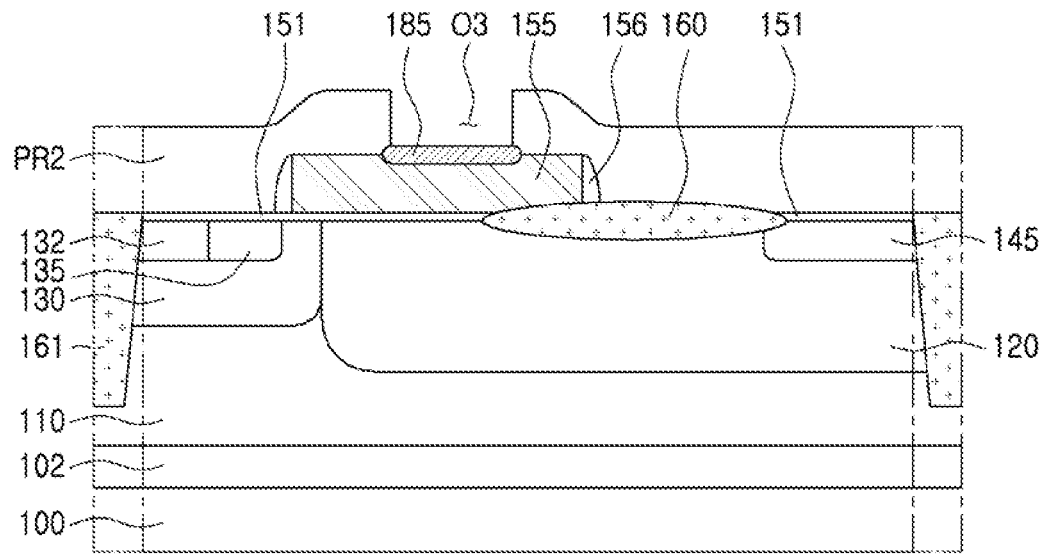
Figure 13B:
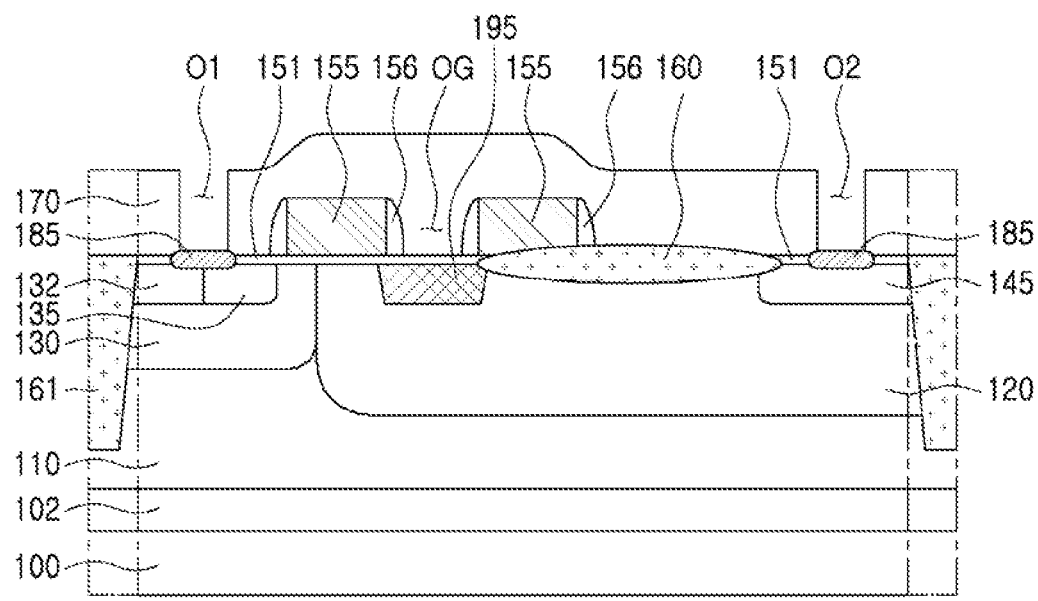

Referring to FIGS. 13A and 13B, a second photoresist pattern PR2 is used to form a metal silicide layer 185 in contact regions of source and drain regions 135 and 145.

The second photoresist pattern PR2 has first and second openings O1 and O2, in which contact regions of the source and drain regions 135 and 145 are exposed, and a metal silicide layer 185 is formed in the contact regions of the source and drain regions 135 and 145, exposed through the first and second openings O1 and O2. In this process, when the gate electrode 155 includes polysilicon, the second photoresist pattern PR2 forms a third opening O3, in which a contact region of the gate electrode 155 is exposed, to form a metal silicide layer 185. In this silicide formation process, the closed-type opening OG of the gate electrode 155 may be covered by the second photoresist pattern PR2 so as not to be externally exposed.

Then, an interlayer insulating film 170 covering the gate electrode 155 is formed on the gate insulating film 151, contact holes are formed in the interlayer insulating film 170, and a source contact plug 180S, a drain contact plug 180D, and a gate contact plug 180G, filling contact holes, respectively, may be provided. For example, a conductive material filling the contact holes may be formed using a sputtering process or ALD process to include, for example, metal, metal nitride, or doped polysilicon, on the interlayer insulating film 170. The source contact plug 180S, the drain contact plug 180D, and the gate contact plug 180G may be connected to the source and drain regions 135 and 145 and the gate electrode 155, respectively, with low contact resistance, through the metal silicide layer 185.

Figure 14:
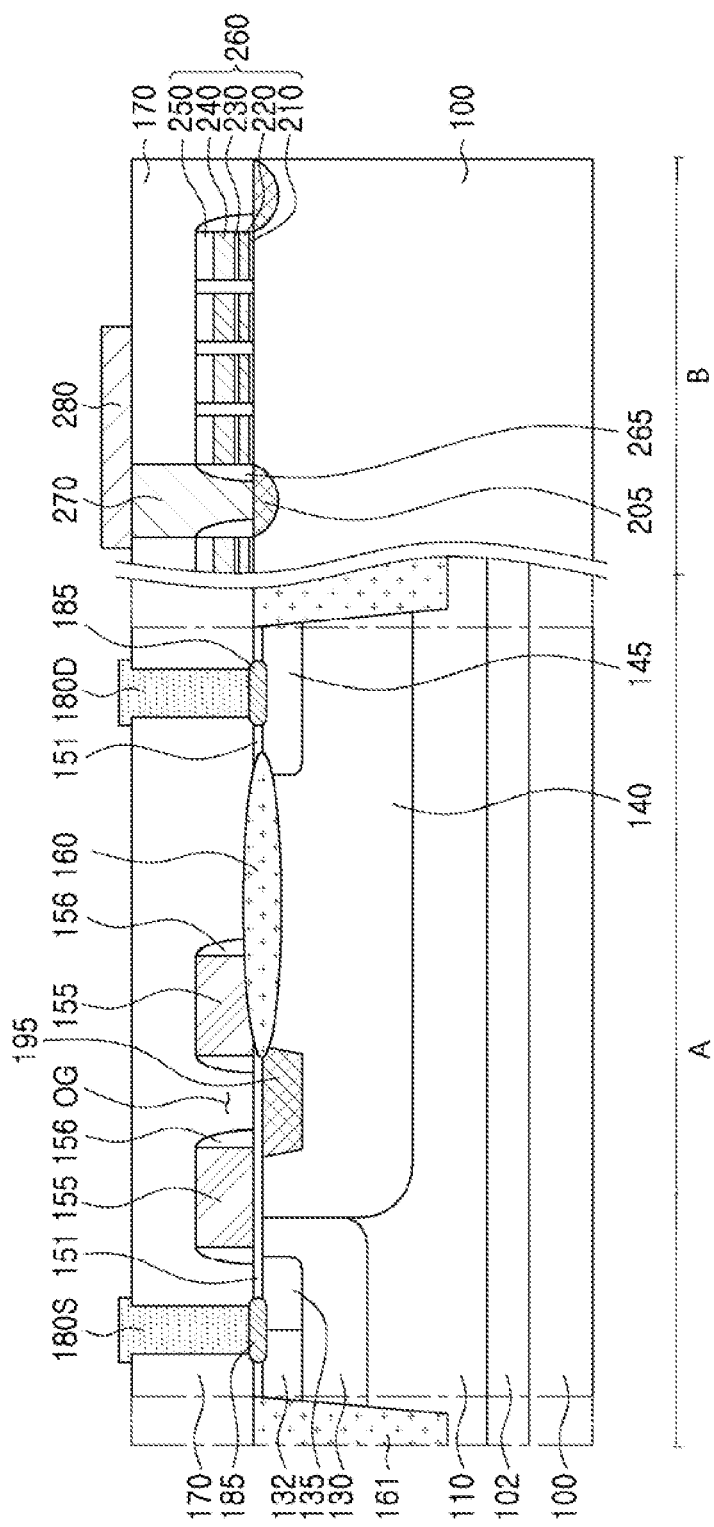
FIG. 14 is a cross-sectional view illustrating a semiconductor device (a power MOS transistor+a memory device) according to an example embodiment of the present disclosure.

FIG. 14 is a cross-sectional view illustrating a semiconductor device (a power MOS transistor+a memory device) according to an example embodiment of the present disclosure. Detailed descriptions of the configuration and/or a structure described with reference to FIGS. 3, 4A, and 4B are omitted and may be assumed to be at least similar to corresponding elements that have been described elsewhere, and the same reference numerals may be used to represent similar or identical elements as described elsewhere.

Referring to FIG. 14, a semiconductor device, according to an example embodiment, may have a structure in which a LDMOS device and a memory device are merged. The LDMOS device may have a similar structure and/or configuration as described with reference to FIGS. 3, 4A, and 4B (particularly, FIG. 4B). The memory device may include, for example, a flash memory device having nonvolatile characteristics.

As illustrated in FIG. 14, a semiconductor substrate 100 may be divided in to a first region A and a second region B. An LDMOS device, according to example embodiments described above, may be disposed on the first region A of the semiconductor substrate 100. As described previously, a drift region 120, a second conductivity type body region 130, and a drain region 145, spaced apart from each other in a first direction in an upper portion of the substrate 100 of the first region A, may be disposed. The gate electrode 155 may extend from one region of the second conductivity type body region 130 to one region of the drift region 120 in the first direction on the gate insulating film 151. A portion of the gate electrode 155 may be disposed on the drain isolation insulating film 160. In some embodiments, the LDMOS device may be provided as a transistor, an inverter, or a booster for power control, constituting a switching mode power supply (SMPS).

The second region B of the semiconductor substrate 100 may be provided as a memory region. A plurality of memory cells 260 may be arranged, for example, in the first direction, on the second region B of the semiconductor substrate 100. Each memory cell 260 may extend in the second direction.

The memory cell 260 may include a tunnel insulating film pattern 210, a charge storage pattern 220, a dielectric pattern 230, and a gate line 240m sequentially stacked on an upper surface of the semiconductor substrate 100. The gate line 240 may be provided as, for example, a coupling gate or a control gate. A gate mask 250 may be further formed on the gate line 240. In some embodiments, the memory cell 260 may be formed using a film material for manufacturing an LDMOS device, a deposition process and/or an etching processes.

In some embodiments, the gate insulating film 151 and the dielectric pattern 230 may have a structure in which a plurality of insulating films are stacked. The gate electrode 155 and the gate line 240 may include a metal, metal silicide and/or metal nitride. The gate mask 250 may include, for example, silicon nitride or silicon oxynitride. A spacer 265, including silicon nitride or silicon oxynitride, may be formed on a side wall of the memory cell 260.

The interlayer insulating film 170 may cover the gate electrode 155 and the memory cells 260 on the first region A and the second region B. An impurity region 205 may be formed in an upper portion of the semiconductor substrate 100 between adjacent pairs of memory cells 260. A portion of the impurity region 205 may be provided as a common source line (CSL).

The plug 270 may pass through the interlayer insulating film 180 to be electrically connected to the impurity region 205. The plug 270 may be provided as, for example, a CSL contact or a bit line contact. A conductive line 280, electrically connected to the plug 270, may be disposed on the interlayer insulating film 170. The conductive line 280 may be provided as, for example, a bit line.

As described previously, in the first region A and the second region B, a material and/or a process for formation of an LDMOS device and a memory device may be merged. Accordingly, the process integration and process efficiency may be increased.

As set forth above, according to example embodiments of the present inventive concept, in a semiconductor device having a MOS structure, a closed-type opening is formed in a gate electrode, so parasitic capacitance (Cgg and/or Cgd) is reduced to improve switching characteristics. Meanwhile, impurities are additionally injected into a drift region through the closed-type opening, so hot carrier safe operating area (SOA) characteristics may be increased without a reduction in a breakdown voltage.

While example embodiments have been shown and described above, it will be apparent to those skilled in the art that modifications and variations could be made thereto without departing from the scope of the present disclosure.

What is claimed is:

1. A semiconductor device, comprising:
    a semiconductor substrate;
    a drift region disposed in the semiconductor substrate, the drift region having a first conductivity type;
    a body region disposed in the semiconductor substrate; adjacent to the drift region, the body region having a second conductivity type that is different from the first conductivity type;
    a drain region disposed in the drift region, opposite to the body region;
    a drain isolation insulating film disposed in a portion of the drift region that is adjacent to the drain region;
    a gate insulating film disposed on the semiconductor substrate and extending over a portion of the body region and a portion of the drift region; and
    a gate electrode disposed on the gate insulating film and having at least one opening that is fully surrounded by the gate electrode in a plan view,
    wherein a ratio between an area of the at least one opening and an area of the gate electrode is within a range of 2:8 to 8:2.

2. The semiconductor device of claim 1, wherein the at least one opening has a region overlapping the drift region.

3. The semiconductor device of claim 2, further comprising:
    a first conductivity type impurity region disposed in a region overlapping the at least one opening.

4. The semiconductor device of claim 3, wherein
    the first conductivity type impurity region has an impurity concentration greater than impurity concentration of the drift region.

5. The semiconductor device of claim 3, wherein the first conductivity type impurity region is spaced apart from the body region.

6. The semiconductor device of claim 5, wherein a distance between the first conductivity type impurity region and the body region is at least 0.1 μm.

7. The semiconductor device of claim 1, wherein the at least one opening includes a plurality of closed-type openings.

8. The semiconductor device of claim 7, wherein the body region, the drift region, and the drain region are arranged in a first direction, and the at least one opening are arranged in a second direction intersecting the first direction, between the body region and the drain region.

9. The semiconductor device of claim 8, wherein the plurality of openings are arranged in a plurality of rows.

10. The semiconductor device of claim 1, wherein a planar shape of the at least one opening has a rounded portion or an inner corner having an obtuse angle.

11. The semiconductor device of claim 1, further comprising:
   a source region disposed in the body region and having the first conductivity type, and
   a body contact region disposed adjacent to the source region in the body region and having the second conductivity type.

12. The semiconductor device of claim 1, wherein the drain isolation insulating film includes local oxidation of silicon (LOCOS) disposed on a region of an upper surface of the semiconductor substrate between the gate electrode and the drain region.

13. The semiconductor device of claim 1, wherein the drain isolation insulating film includes a shallow trench insulator (STI) disposed in a region of the semiconductor substrate between the gate electrode and the drain region.

14. A semiconductor device, comprising:
   a semiconductor substrate;
   a drift region disposed in the semiconductor substrate, the drift region extended to an upper surface of the semiconductor substrate and having a first conductivity type;
   a body region disposed in the semiconductor substrate and sharing a boundary with the drift region, the body region extended to the upper surface of the semiconductor substrate and having a second conductivity type that is different from the first conductivity type;
   a gate insulating film disposed on a boundary between the body region and the drift region, the gate insulating film extended over a portion of the body region and a portion of the drift region; and
   a gate electrode disposed on the gate insulating film and having a plurality of openings that are each fully surrounded by the gate electrode in a plan view,
   wherein each of the plurality of openings has a region overlapping the drift region, and
   wherein a planar shape of at least one of the plurality of openings has a rounded portion or an inner corner having an obtuse angle.

15. The semiconductor device of claim 14, further comprising:
   a plurality of first conductivity type impurity regions overlapping the plurality of openings, respectively, and having an impurity concentration greater than an impurity concentration of the drift region.

16. The semiconductor device of claim 14, further comprising:
   a drain region disposed opposite to the body region in the drift region and having the first conductivity type,
   a source region disposed in the body region and having the first conductivity type, and
   a body contact region disposed adjacent to the source region in the body region and having the second conductivity type.

17. The semiconductor device of claim 16, further comprising:
   a drain isolation insulating film disposed between the drift region and the drain region.

18. A semiconductor device, comprising:
   a semiconductor substrate;
   a drift region disposed in the semiconductor substrate, and having a first conductivity type;
   a body region disposed in the semiconductor substrate, adjacent to the drift region, and having a second conductivity type that is different from the first conductivity type;
   a drain region disposed in the drift region, opposite to the body region, and having a first conductivity type;
   a source region disposed in the body region and having the first conductivity type;
   a body contact region disposed in the body region, adjacent to the source region, and having the second conductivity type;
   a drain isolation insulating film disposed in a portion of the drift region that is adjacent to the drain region;
   a gate electrode disposed on the semiconductor substrate and extended over both a portion of the body region and a portion of the drift region, and having at least one opening that is fully surrounded by the gate electrode in a plan view;
   a gate insulating film disposed between the gate electrode and the semiconductor substrate; and
   a first conductivity type impurity region disposed in a portion of the drift region overlapping the at least one opening and having an impurity concentration that is greater than an impurity concentration of the drift region.

19. The semiconductor device of claim 18, farther comprising:
   a first contact plug connected to both the body contact region and the source region, and a second contact plug connected to the drain region.

* * * * *